(12) United States Patent
Shoji et al.

(10) Patent No.: US 12,142,538 B2
(45) Date of Patent: Nov. 12, 2024

(54) FABRICATION METHOD OF SEMICONDUCTOR DEVICE AND TEST METHOD OF SEMICONDUCTOR DEVICE

(71) Applicant: FUJI ELECTRIC CO., LTD., Kanagawa (JP)

(72) Inventors: Atsushi Shoji, Matsumoto (JP); Soichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 481 days.

(21) Appl. No.: 17/581,966

(22) Filed: Jan. 23, 2022

(65) Prior Publication Data

US 2022/0301948 A1    Sep. 22, 2022

(30) Foreign Application Priority Data

Mar. 17, 2021   (JP) ................. 2021-044127

(51) Int. Cl.
*H01L 21/66* (2006.01)
*H01L 21/225* (2006.01)
*H01L 29/40* (2006.01)

(52) U.S. Cl.
CPC ............ *H01L 22/14* (2013.01); *H01L 21/225* (2013.01); *H01L 29/401* (2013.01)

(58) Field of Classification Search
CPC ...................................................... H01L 22/14
See application file for complete search history.

(56) References Cited

U.S. PATENT DOCUMENTS

| 10,355,089 B2 | 7/2019 | Saito |
| 2017/0077004 A1* | 3/2017 | Onozawa ................ H01L 22/32 |

FOREIGN PATENT DOCUMENTS

JP        2017157851 A     9/2017

* cited by examiner

*Primary Examiner* — Joseph C. Nicely

(57) ABSTRACT

Provided is a fabrication method of a semiconductor device comprising an element forming process of forming a semiconductor element in a semiconductor substrate and forming a metal electrode above the semiconductor substrate; a plating process of plating the metal electrode; an annealing process of annealing the semiconductor substrate; a voltage applying process of applying a voltage corresponding to a thickness of the gate insulating film to the gate insulating film after the annealing process; and a judging process of measuring a threshold voltage of the semiconductor element after the voltage applying process, and judging a quality of the semiconductor element based on a measurement result.

20 Claims, 12 Drawing Sheets

| TEMPERATURE [°C] | 175 | | | | | |
|---|---|---|---|---|---|---|
| ELECTRIC FIELD [kV/μm] | 2.73 | 3.64 | 4.55 | 4.91 | 5.09 | 5.27 | 5.45 |
| JUDGING | × | × | ○ | ○ | ○ | ○ | ○ |

*FIG. 4*

| ANNEALING TEMPERATURE [°C] | 200 | 260 | | 280 | 300 |
|---|---|---|---|---|---|
| ANNEALING TIME [hrs] | 6.5 | 4 | | 6.5 | |
| JUDGING | × | × | ○ | ○ | ○ |

FIG. 6

FABRICATION METHOD OF SEMICONDUCTOR DEVICE AND TEST METHOD OF SEMICONDUCTOR DEVICE

The contents of the following Japanese patent application are incorporated herein by reference:
NO. 2021-044127 filed in JP on Mar. 17, 2021.

BACKGROUND

1. Technical Field

The present invention relates to a fabrication method of a semiconductor device and a test method of a semiconductor device.

2. Related Art

In the related art, known is a configuration of plating a surface of an electrode of a semiconductor device comprising a transistor (for example, refer to Patent Document 1).
Patent Document 1: Japanese Patent Application Publication No. 2017-157851

The summary clause does not necessarily describe all necessary features of the embodiments of the present invention.
The present invention may also be a sub-combination of the features described above.

BRIEF DESCRIPTION OF THE DRAWINGS

FIG. 4 illustrates a condition in a voltage applying process S212.
FIG. 6 shows an example of an annealing condition in an annealing process S210.

DESCRIPTION OF EXEMPLARY EMBODIMENTS

Hereinafter, (some) embodiment(s) of the present invention will be described. The following embodiment(s) do(es) not limit the invention according to the claims. Also, all the combinations of the features described in the embodiment(s) are not necessarily essential to solutions provided by the invention.

As used herein, one side in a direction parallel to a depth direction of a semiconductor substrate is referred to as 'upper' and the other side is referred to as 'lower'.
One surface of two principal surfaces of a substrate, a layer or other member is referred to as 'upper surface', and the other surface is referred to as 'lower surface'.
The 'upper' and 'lower' directions are not limited to a gravity direction or a direction at the time when implementing a semiconductor device.
As used herein, the description 'same' or 'equal' may include a case where there is an error due to manufacturing variation and the like.
The error is, for example, within 10%.
As used herein, a conductivity type of a doped region in which impurities are doped is described as P type or N type.
As used herein, P+ type or N+ type means that a doping concentration is higher than P type or N type, and P− type or N− type means that a doping concentration is lower than P type or N type.

Figure 1:
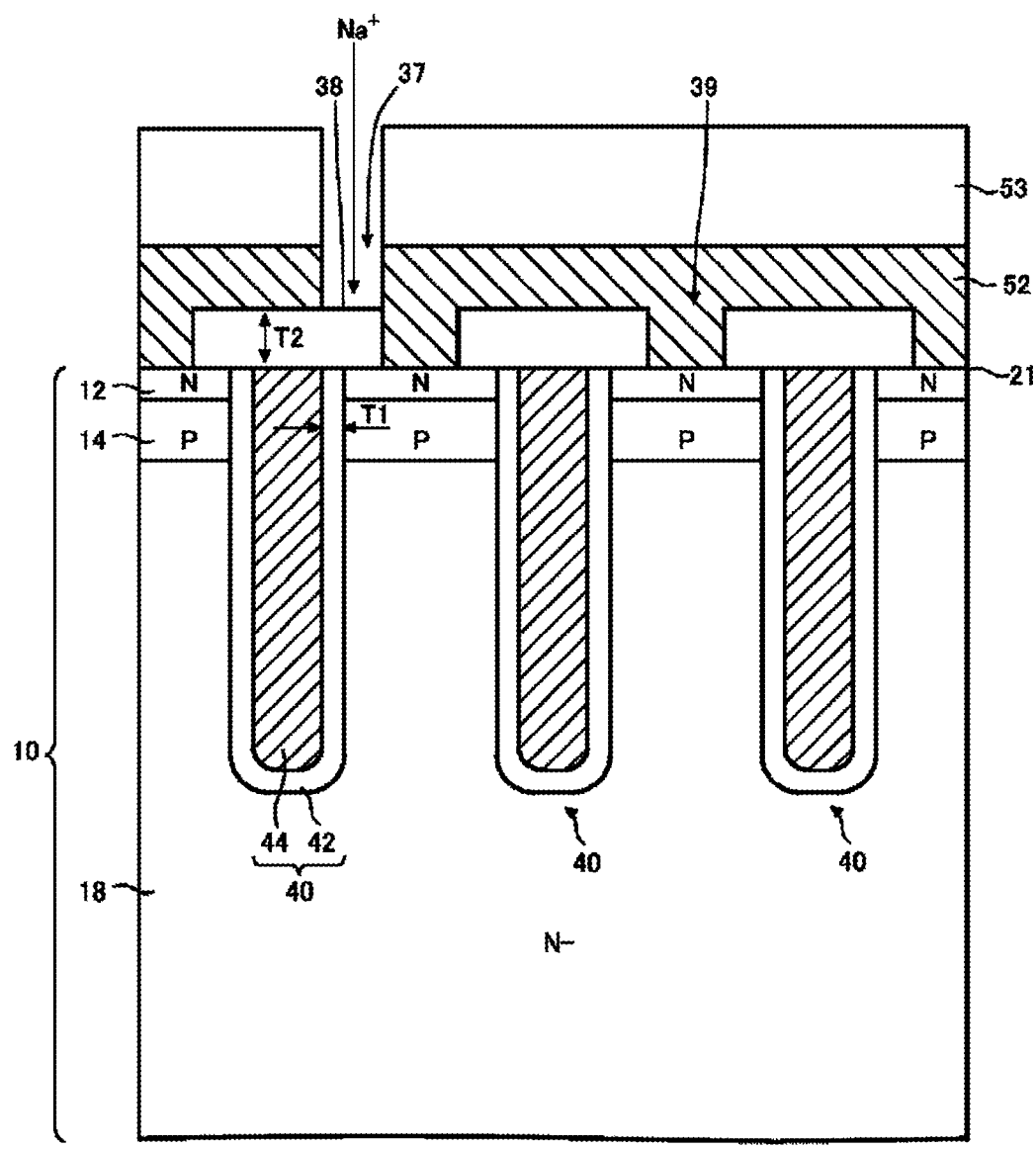
FIG. 1 is a cross sectional view showing an example of a semiconductor device 100.

FIG. 1 is a cross sectional view showing an example of a semiconductor device 100.
The semiconductor device 100 comprises a semiconductor substrate 10.
The semiconductor substrate 10 is a substrate formed of a semiconductor material.
As an example, the semiconductor substrate 10 is a silicon substrate, but a material of the semiconductor substrate 10 is not limited to silicon.
In FIG. 1, only a partial region of an upper surface 21-side of the semiconductor device 100 is shown.

In the cross section, the semiconductor device 100 of the present example comprises the semiconductor substrate 10, an interlayer insulating film 38, a metal electrode 52 and a plated layer 53.
The interlayer insulating film 38 is provided on the upper surface 21 of the semiconductor substrate 10.
The interlayer insulating film 38 is a film including at least one layer of an insulating film such as silicate glass or the like added with impurities of boron, phosphorous or the like, a thermal oxide film and other insulating film.
The interlayer insulating film 38 is provided with contact holes 39 for exposing portions of the upper surface 21 of the semiconductor substrate 10.
The metal electrode 52 is provided above the interlayer insulating film 38.
The metal electrode 52 may be formed of metal such as aluminum or an alloy.
The metal electrode 52 may be formed to have a thickness of 2.5 μm to 7.5 μm by a sputtering method.
The metal electrode 52 is an emitter electrode in an IGBT (Insulated Gate Bipolar Transistor) or a source electrode in a MOSFET, for example.
The metal electrode 52 is in contact with the semiconductor substrate 10 through the contact holes 39 of the interlayer insulating film 38.
A barrier metal layer such as titanium may be provided between the interlayer insulating film 38 and the metal electrode 52, and between semiconductor substrate 10 and the metal electrode 52.
The barrier metal layer may be formed thinner than the metal electrode 52.
A plug electrode of tungsten or the like may be filled in the contact holes 39 of the interlayer insulating film 38, and the metal electrode 52 may be provided thereon.
The semiconductor substrate 10 has an N type emitter region 12, a P type base region 14 and an N− type drift region 18 sequentially from the upper surface 21-side.

The emitter region 12 and the base region 14 may be formed by locally injecting impurities in the semiconductor substrate 10.

The semiconductor substrate 10 may also have a region in which impurities are locally injected, in addition to these regions.

Although not shown in FIG. 1, an N type or P type region is provided below the drift region 18, according to the type of the semiconductor device 100.

The upper surface 21 of the semiconductor substrate 10 is provided with one or more gate trench portions 40.

The gate trench portion 40 is reaching the drift region 18 from the upper surface 21 of the semiconductor substrate 10.

The emitter region 12 and the base region 14 are in contact with a sidewall of the gate trench portion 40.

The gate trench portion 40 has a gate insulating film 42 and a gate conductive portion 44.

The gate insulating film 42 is provided covering an inner wall of a trench (groove portion) provided in the upper surface 21 of the semiconductor substrate 10.

The gate insulating film 42 may also be formed by oxidizing or nitriding a semiconductor of the inner wall of the trench. The gate insulating film 42 of the present example is a thermal oxide film formed by oxidizing the inner wall of the trench.

The gate conductive portion 44 is provided on a further inner side than the gate insulating film 42 in the trench.

That is, the gate insulating film 42 insulates the gate conductive portion 44 and the semiconductor substrate 10 each other.

The gate conductive portion 44 is formed of a conductive material such as polysilicon.

In the present example, a thickness of the gate insulating film 42 is denoted as T1(μm).

The thickness T1 is a thickness of the gate insulating film 42 in a direction perpendicular to the inner wall of the trench. The thickness T1 may also be a thickness of the gate insulating film 42 in a direction parallel to the upper surface 21 of the semiconductor substrate 10.

As the thickness T1, an average value of thicknesses of the gate insulating film 42 of a portion in contact with the base region 14 may also be used.

The gate conductive portion 44 is provided longer than the base region 14 in the depth direction.

The gate trench portion 40 in the cross section is covered with the interlayer insulating film 38 on the upper surface 21 of the semiconductor substrate 10.

Thereby, the gate insulating film 42 and the gate conductive portion 44 of the gate trench portion 40 are insulated from the metal electrode 52.

In the present example, a thickness of the interlayer insulating film 38 is denoted as T2(μm).

The thickness T2 is a thickness of the interlayer insulating film 38 in the direction perpendicular to the upper surface 21 of the semiconductor substrate 10.

As the thickness T2, a minimum value of thicknesses of the interlayer insulating film 38 of a portion in contact with the gate insulating film region 42 may also be used.

The gate conductive portion 44 is electrically connected to a gate runner (not shown) insulated from the metal electrode 52.

When a predetermined gate voltage is applied to the gate conductive portion 44, a channel by an inversion layer of electrons is formed in a surface layer of an interface of the base region 14 in contact with the gate trench portion 40.

Thereby, the semiconductor device 100 becomes an ON state where current flows between the upper surface 21 and a lower surface of the semiconductor substrate 10.

A gate voltage at which the semiconductor device 100 becomes the ON state is referred to as a threshold voltage.

In the example of FIG. 1, the gate voltage is applied to all the gate trench portions 40.

In another example, some of the gate trench portions 40 may be connected to the metal electrode 52 without being applied with the gate voltage.

In this case, the gate trench portions 40 do not function as gates for switching transistors and function as dummy gates. By arranging the dummy gates, a carrier concentration in the drift region 18 can adjusted to adjust an on resistance of the semiconductor device 100.

The plated layer 53 is provided on the metal electrode 52. The plated layer 53 is formed of a material such as gold, copper, a nickel alloy or the like, for example, and is formed in a single layer or by a stacked layer.

For example, in a case where the metal electrode 52 is an alloy layer having aluminum as a main component, a nickel alloy is first plated in a thickness of 2.0 μm to 6.0 μm on the metal electrode 52 and gold is plated in a thickness of 0.01 μm to 0.10 μm thereon, so that a stacked layer may be formed.

An upper surface of the plated layer 53 may be provided with a wiring (not shown) such as a lead frame soldered thereon.

In a plating process of forming the plated layer 53, the upper surface of the metal electrode 52 may be immersed in a plating solution containing ions such as sodium.

In the plating process, ions contained in the plating solution may reach the semiconductor substrate 10.

For example, in a process such as sputtering of forming the metal electrode 52, the metal electrode 52 may be formed with a through-hole 37 that is not intended.

When the interlayer insulating film 38 is exposed by the through-hole 37, sodium ions and the like may reach the interlayer insulating film 38 through the through-hole 37 and reach even the semiconductor substrate 10 through the interlayer insulating film 38.

Similarly, when the upper surface 21 of the semiconductor substrate 10 is exposed by the through-hole 37, sodium ions and the like may reach the semiconductor substrate 10 through the through-hole 37.

When sodium ions and the like reaching the semiconductor substrate 10 are injected to the gate insulating film 42, a charged state of the gate insulating film 42 changes, so that the threshold voltage may vary.

For example, in a case where the semiconductor device 100 is put into a high-temperature environment, sodium ions and the like are highly likely to reach the gate insulating film 42, so that the threshold voltage may vary.

Therefore, in a manufacturing process of the semiconductor device 100, a device whose threshold voltage is highly likely to vary due to an influence of sodium ions and the like is preferably screened in advance.

Figure 2:
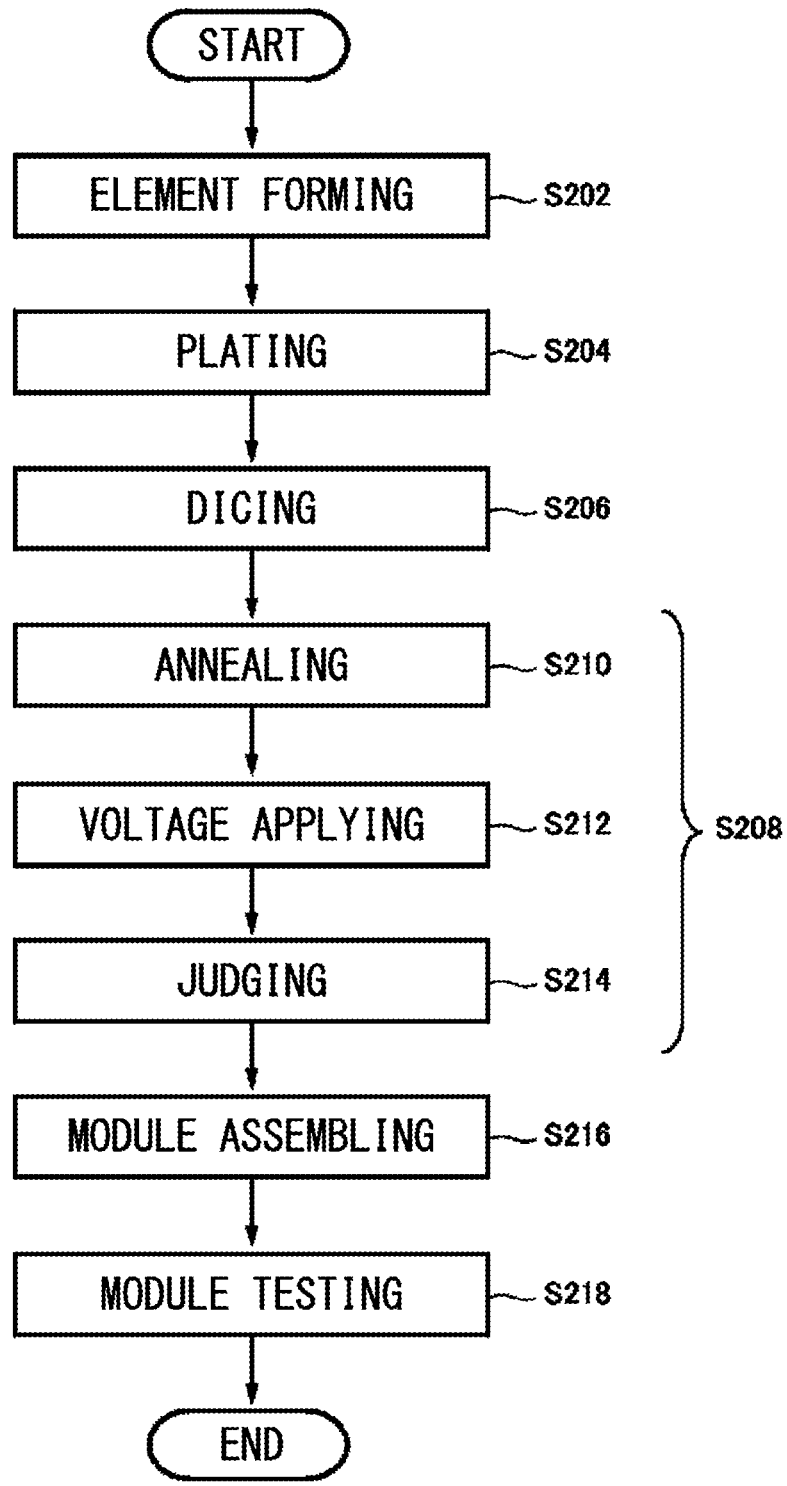
FIG. 2 shows an outline of a fabrication method of the semiconductor device 100.

FIG. 2 shows an outline of a fabrication method of the semiconductor device 100.

The fabrication method may comprise only some of processes shown in FIG. 2.

In the present example, a plurality of semiconductor chips is formed using a semiconductor wafer.

First, in an element forming process S202, the semiconductor substrate 10 is formed with semiconductor elements, and the metal electrode 52 is formed above the semiconductor substrate 10.

The semiconductor substrate 10 in the element forming process S202 is in a wafer shape.

The semiconductor elements are, for example, a MOSFET, an IGBT or the like. In the example of FIG. 1, the semiconductor element has the emitter region 12, the base region 14, the drift region 18 and the gate trench portions 40. In the element forming process S202, the interlayer insulating film 38 shown in FIG. 1 may also be formed.

In addition, in the element forming process S202, the lower surface of the semiconductor substrate 10 may also be formed with a metal electrode.

Next, in a plating process S204, an upper surface of the metal electrode 52 is plated to form the plated layer 53.

In the plating process S204, the upper surface of the metal electrode 52 may be immersed in a plating solution containing ions of sodium or the like, and a plating material such as gold, copper and a nickel alloy.

In the plating process S204, the plated layer 53 may also be formed by electroless plating or the like.

Next, in a dicing process S206, the semiconductor wafer is diced to cut a plurality of semiconductor chips.

The dicing process S206 may include a process of pasting a dicing tape on the semiconductor wafer before dicing so that the plurality of semiconductor chips is not split apart.

Next, in a test process S208, each semiconductor device 100 having a chip shape is tested.

In the test process S208 of the present example, a threshold voltage of the semiconductor device 100 is tested by an annealing process S210, a voltage applying process S212 and a judging process S214.

In the test process S208, the semiconductor device 100 may also be tested for items other than the threshold voltage test. In the test process S208, the semiconductor devices 100 are sorted into non-defective products and defective products, respectively.

In an annealing process S210, the semiconductor substrate 10 is annealed. In the annealing process S210, the semiconductor device 100 may be put into an annealing furnace or the like, and the semiconductor device 100 may be annealed as a whole.

In the annealing process S210, the semiconductor device 100 is preferably annealed in a condition that at least some of sodium ions incorporated into an upper surface of the interlayer insulating film 38 can pass through the interlayer insulating film 38 in a thickness direction.

As an example, an annealing temperature in the annealing process S210 is 240° C. or higher and 300° C. or lower.

Next, in a voltage applying process S212, a predetermined voltage is applied to the gate insulating film 42.

In the voltage applying process S212, a predetermined voltage is applied to the gate conductive portion 44 via a gate runner.

A potential of the upper surface 21 of the semiconductor substrate 10 may be the same as a potential of the metal electrode 52.

The potential of the metal electrode 52 may be a ground potential, as an example.

In the voltage applying process S212, the predetermined voltage is applied to the gate insulating film 42, so that sodium ions or the like present near the gate insulating film 42 are pulled to the gate insulating film 42.

A polarity of the voltage that is applied to the gate conductive portion 44 is a polarity opposite to ions that are pulled to the gate insulating film 42.

In the present example, since sodium ions that are positive ions are pulled, a negative voltage is applied to the gate conductive portion 44.

Further, in the voltage applying process S212, a voltage corresponding to the film thickness T1 of the gate insulating film 42 is preferably applied to the gate insulating film 42 (or the gate conductive portion 44) so that sodium ions can be incorporated into the gate insulating film 42.

In the voltage applying process S212 of the present example, a negative voltage by which an electric field greater than 3.64 kV/μm is applied with respect to a unit thickness of the gate insulating film 42 is applied to the gate conductive portion 44. Thereby, an influence of sodium ions or the like on the threshold voltage can be exposed.

Next, in a judging process S214, the threshold voltage of the semiconductor element (the semiconductor device 100, in the present example) is measured, and a quality of the semiconductor element is judged based on a measurement result.

In the judging process S214, the quality of each semiconductor device 100 may be judged by comparing the measured threshold voltage with a reference value set in advance.

Next, in an assembling process S216, a semiconductor package is assembled using the semiconductor device 100 judged as being non-defective.

The semiconductor package may also be a semiconductor module having a control circuit configured to control the semiconductor device 100, in addition to the semiconductor device 100.

The semiconductor module may have a resin casing configured to accommodate the semiconductor device 100 and the control circuit.

Next, in a package test process S218, the semiconductor package is tested. In the package test process S218, an item for testing an operation of the semiconductor device 100 may be included.

According to the present example, the semiconductor package is assembled using the semiconductor device 100 made as being non-defective in the threshold voltage test. Therefore, it is possible to reduce the semiconductor packages that are judged as defective in the package test process S218, and to reduce the overall manufacturing cost.

In the fabrication method of the present example, the semiconductor device 100 is annealed and tested before the assembling process S216.

In the package test process S218, a test item of heating the semiconductor package or semiconductor device 100 to 100° C. or higher may not be included.

The semiconductor package may also be a semiconductor discrete, in addition to the semiconductor module.

Figure 3:
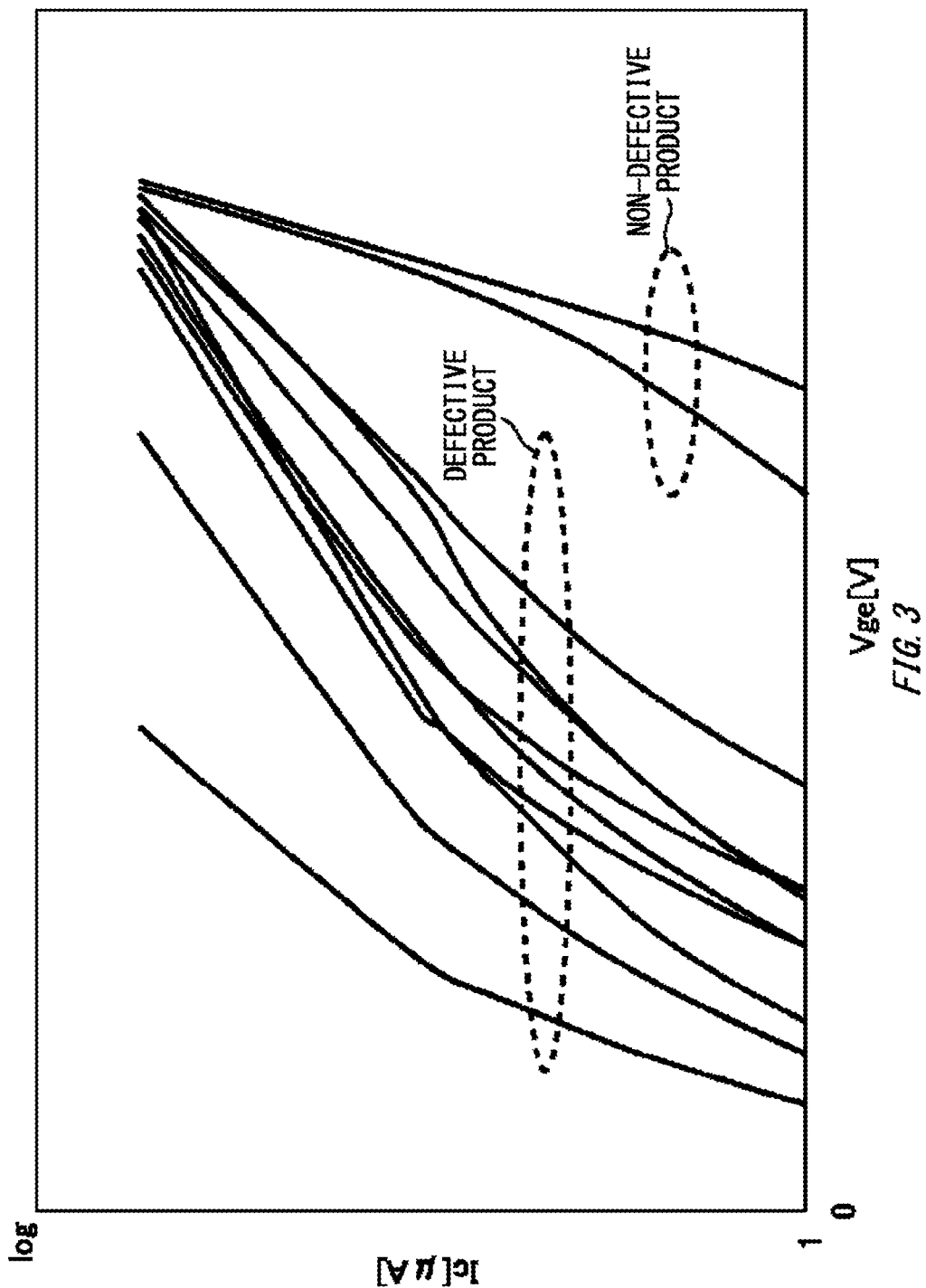
FIG. 3 shows an example of a voltage-current characteristic that is measured in a judging process S214.

FIG. 3 shows an example of a voltage-current characteristic that is measured in the judging process S214.

In FIG. 3, a characteristic of one semiconductor device 100 is shown with one line. In the judging process S214, a gate voltage Vge that is applied to the gate conductive portion 44 of the semiconductor device 100 is changed to measure main current Ic that flows through the semiconductor device 100. The main current Ic is, for example, collector current of an IGBT, drain current of a MOSFET, or the like.

The threshold voltage is the gate voltage Vge at which the main current Ic starts to flow.

As shown in a defective product group of FIG. 3, when sodium ions are injected to the gate insulating film 42, the main current Ic starts to flow at the low gate voltage Vge. In the judging process S214, the voltage-current characteristic as shown in FIG. 3 may be measured to calculate the threshold voltage of each semiconductor device 100.

FIG. 4 illustrates a condition in the voltage applying process S212. In the present example, the electric field was applied to the gate insulating film 42 in a state where the temperatures of the plurality of semiconductor devices 100 were raised to 175° C.

In addition, it was tested whether a failure was detected in the judging process S214 when the electric field to be applied was changed and each electric field was applied. The condition in which the failure was detected in the judging process S214 when an applying time of the electric field was set to 0.2 seconds is shown with a circle symbol in a judging section.

In addition, in the condition for which an X mark is indicated in the judging section, even when the applying time of the electric field was set to 15 minutes, a failure was not detected in the judging process S214.

As shown in FIG. 4, in the example where the electric field of 3.64[kV/μm] was applied to the gate insulating film 42, the semiconductor devices 100 could not be screened in the judging process S214.

On the other hand, in the example where the electric field greater than 3.64[kV/μm] was applied, the semiconductor devices 100 could be screened in the judging process S214. In the voltage applying process S212, a voltage by which an electric field greater than 3.64[kV/μm] is applied with respect to the unit thickness of the gate insulating film 42 is preferably applied to the gate insulating film 42.

In the voltage applying process S212, a voltage by which an electric field of 4.55[kV/μm] or more is applied with respect to the unit thickness of the gate insulating film 42 may also be applied to the gate insulating film 42.

As an example, in a case where the thickness T1 of the gate insulating film 42 is 110 nm, the voltage Vge that is applied to the gate insulating film 42 may be −50V or higher.

In the voltage applying process S212, a temperature of the semiconductor device 100 may be 100° C. or higher and 250° C. or lower.

The temperature may also be 150° C. or higher.

The temperature may also be 200° C. or lower.

In the voltage applying process S212, the higher the temperature is, the lower the electric field to be applied may be.

In the voltage applying process S212, the applying time of the voltage may be 10 seconds or less.

As described above, by setting an appropriate electric field, the semiconductor devices 100 can be screened with a short applying time.

Thereby, the manufacture efficiency can be improved.

The applying time of the voltage may be 1 second or less. The applying time of the voltage may be 0.1 seconds or more, or may be 0.2 seconds or more.

Furthermore, in the annealing process S210, the semiconductor substrate 10 may be annealed so that an average diffusion distance of sodium ions in the interlayer insulating film 38 is to be 70% or more of the thickness T2 of the interlayer insulating film 38.

Thereby, sodium ions incorporated into the interlayer insulating film 38 can be easily diffused to the semiconductor substrate 10.

In the annealing process S210, the semiconductor substrate 10 may be annealed so that the average diffusion distance is to be 85% or more or 100% or more of the thickness T2 of the interlayer insulating film 38.

Figure 5:
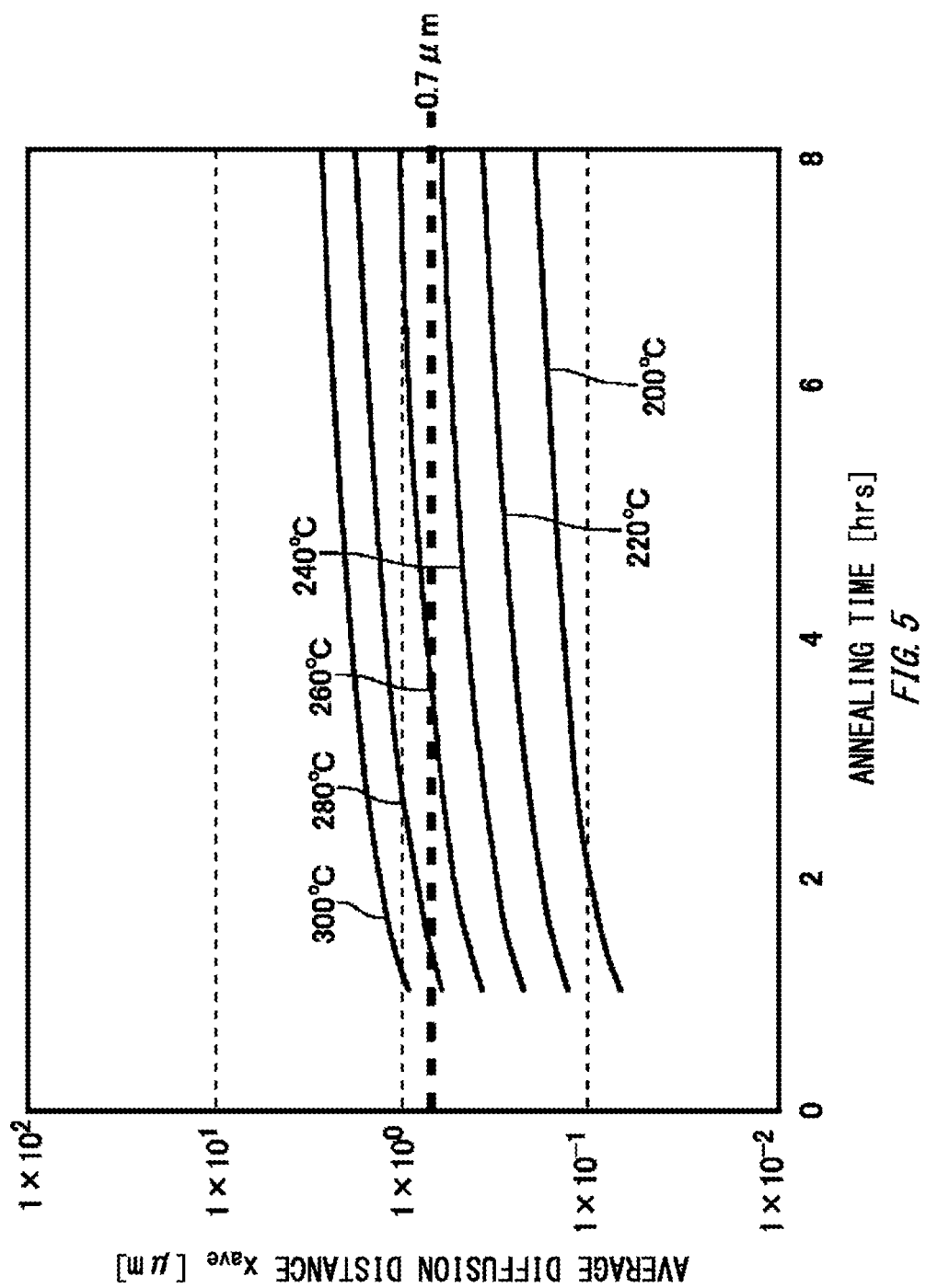
FIG. 5 shows an average diffusion distance of sodium ions in an interlayer insulating film 38.

FIG. 5 shows the average diffusion distance of sodium ions in the interlayer insulating film 38.

The average diffusion distance $x_{ave}$[cm$^2$] of sodium ions in the interlayer insulating film 38 is given by the following equation.

$$x_{ave} = 2 \times (Dt)^{0.5}$$

$$D = D_0 \exp(-Q/kT)$$

Here, t is time [s], D is diffusion coefficient [cm$^2$/s], $D_0$ is diffusion constant [cm$^2$/s], Q is activation energy [eV], k is Boltzmann constant, and T is absolute temperature [K].

As for the diffusion constant $D_o$ and the activation energy Q, constants of an ion that is a target are used.

In the present example, the target ion is sodium ion, and $D_0 = 3.4 \times 10^{-2}$ cm$^2$/s and Q=1.22 eV.

In the example of FIG. 5, the thickness T2 of the interlayer insulating film 38 is 1 μm.

In this case, at least one of the annealing temperature and the annealing time of the semiconductor substrate 10 is preferably adjusted so that the average diffusion distance $x_{ave}$ is to be 0.7 μm or more.

The annealing temperature may be 240° C. or higher and 300° C. or lower.

The annealing temperature may be 260° C. or higher, or may be 280° C. or higher.

By setting the annealing temperature high, it is possible to shorten the annealing time, thereby improving the manufacture efficiency.

In addition, when the annealing temperature is set to 300° C. or lower, breaking and the like of the metal electrode 52 can be prevented.

The annealing temperature may be 290° C. or lower.

FIG. 6 shows an example of an annealing condition in the annealing process S210.

In the present example, the thickness T2 of the interlayer insulating film 38 is 1 μm.

In the judging section of FIG. 6, a case where the semiconductor devices 100 could be screened in the judging process S214 is shown with a circle symbol, and a case where the semiconductor devices 100 could not be screened is shown with an X mark.

In the judging process S214, the applying time of the electric field was set to 0.2 second, and the electric field to be applied to the gate insulating film 42 was set to 4.55[kV/μm].

As shown in FIG. 6, the boundary between the case where the screening is possible and the case where the screening is not possible is the condition of the annealing temperature of 260° C. and the annealing time of 4 h.

Referring to FIG. 5, the average diffusion distance of sodium ions in the above condition is about 70% of the thickness T2 of the interlayer insulating film 38.

As described above, in the annealing process S210, the annealing condition may be set so that a ratio of the average diffusion distance of sodium ions in the interlayer insulating film 38 to the thickness T2 of the interlayer insulating film 38 is 70% or more, the annealing condition may be set so that the ratio is 85% or more or may be set so that the ratio is 100% or more.

Figure 7:
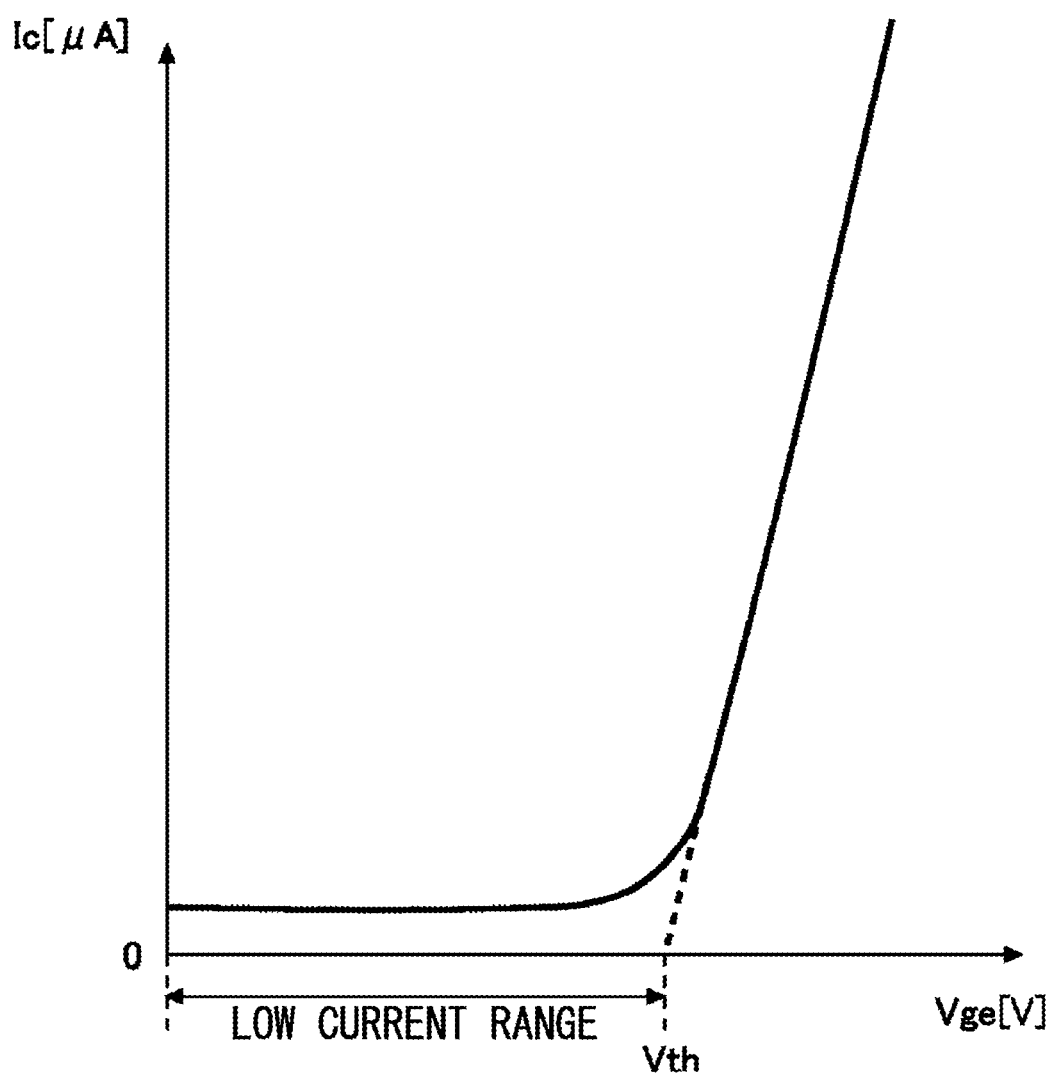
FIG. 7 shows an example of a gate voltage-main current characteristic of the semiconductor device 100.

FIG. 7 shows an example of a gate voltage-main current characteristic of the semiconductor device 100.

In FIG. 7, a characteristic of the non-defective semiconductor device 100 is shown.

In the characteristic of the non-defective semiconductor device 100, a voltage at which a line (dashed line shown in FIG. 7) extending a rising waveform of current and a horizontal axis (Vge) intersect with each other is set as a reference threshold voltage Vth.

For the reference threshold voltage Vth, a predetermined value such as a design value of the semiconductor device 100 may also be used.

A range from the reference threshold voltage Vth to 0V is set as a low current range.

In the judging process S214, the threshold voltage of each semiconductor device 100 may be measured by changing the gate voltage Vge within the low current range.

By the annealing process S210 and the voltage applying process S212, the threshold voltage of the defective semiconductor device 100 changes within the low current range. By measuring the threshold voltage within the range, it is possible to effectively detect variation in threshold due to sodium ions and the like.

Figure 8:
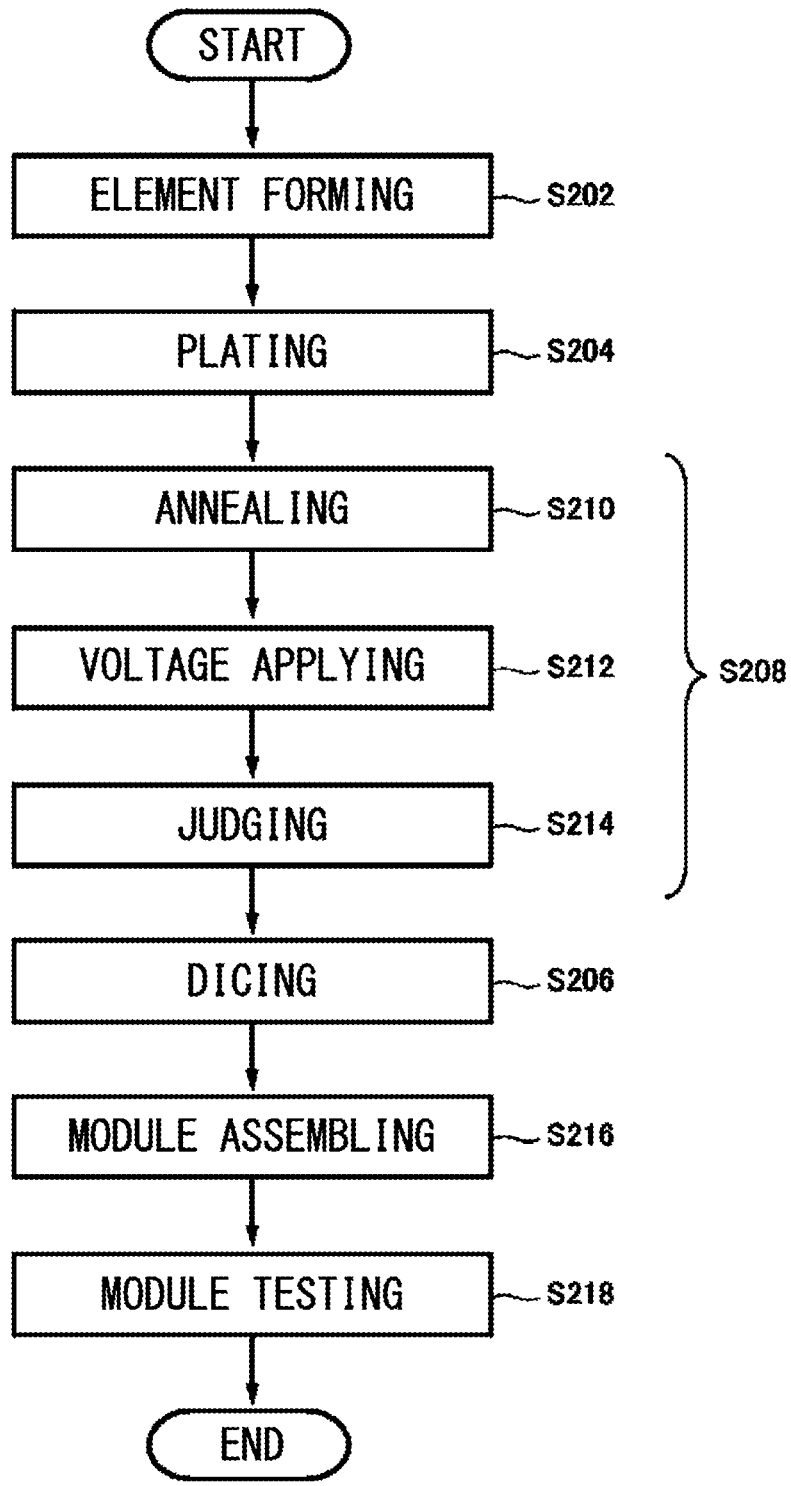
FIG. 8 shows another example of the fabrication method of the semiconductor device 100.

FIG. 8 shows another example of the fabrication method of the semiconductor device 100.

In the fabrication method of the present example, the test process S208 is performed after the plating process S204 and before the dicing process S206.

That is, in the test process S208, the semiconductor device 100 in a wafer form is tested. The content of each process is similar to the example of FIG. 2.

In the test process S208, the plurality of semiconductor devices 100 in the semiconductor wafer may be tested in parallel.

In the annealing process S210, it is possible to anneal the plurality of semiconductor devices 100 at the same time by putting the semiconductor wafer into the annealing furnace.

In the voltage applying process S212 and the judging process S214, it is possible to perform an electrical test on the plurality of semiconductor devices 100 in parallel by bringing a probe pin into contact with each semiconductor device 100.

In the present example, since it is possible to handle the plurality of semiconductor devices 100 in parallel, the test time is not lengthened so much even when the voltage applying time in the voltage applying process S212 is lengthened.

The voltage applying time of the present example may be 20 minutes or less, 10 minutes or less, 5 minutes or less or 1 minute or less.

By lengthening the voltage applying time, an influence of sodium ions or the like on the threshold voltage can be exposed.

Figure 9:
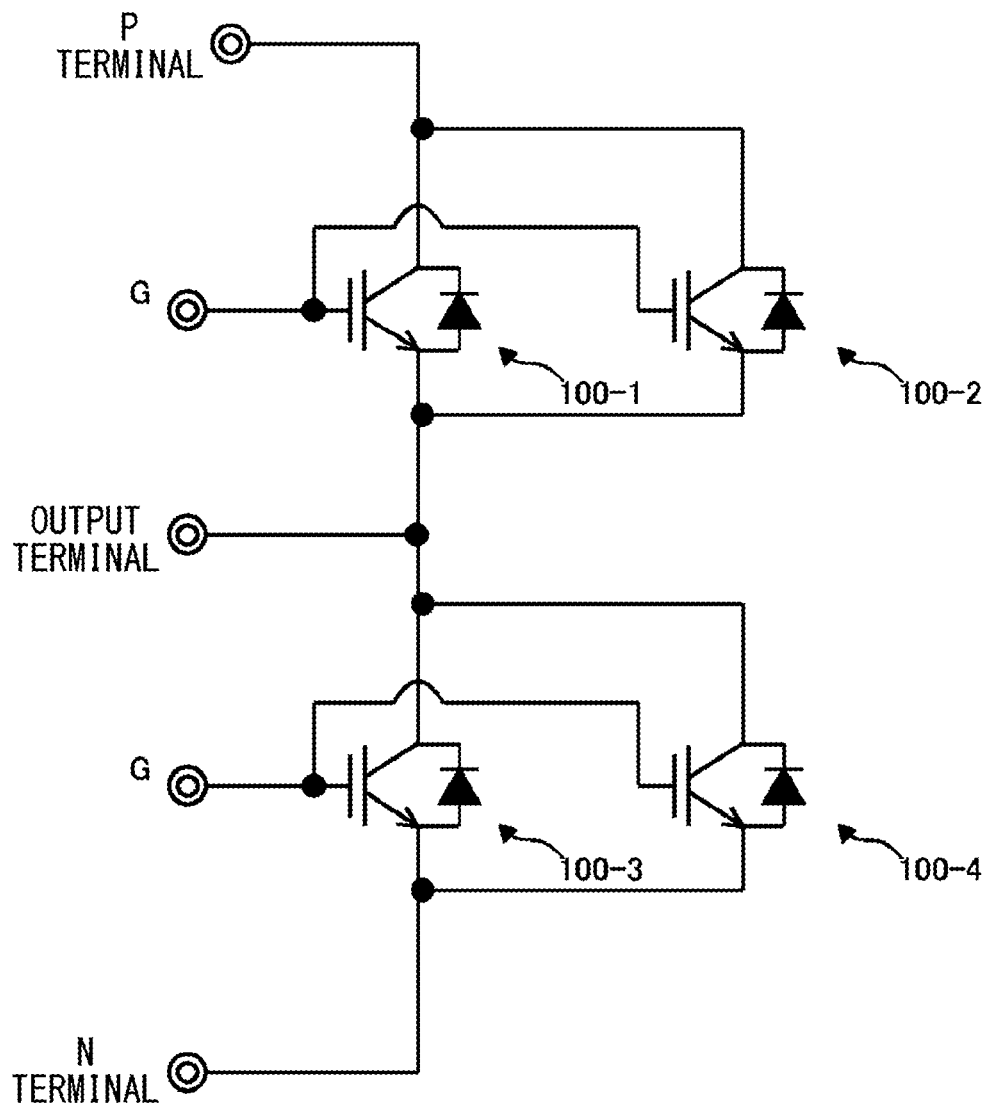
FIG. 9 is a circuit diagram showing an example of a circuit 200 that is provided in a resin casing of a semiconductor module.

FIG. 9 is a circuit diagram showing an example of a circuit 200 that is provided in the resin casing of the semiconductor module.

The circuit 200 is a circuit configured to supply electrical power to a load such as a motor.

The semiconductor module may include the circuit 200 in plural.

For example, the semiconductor module may be a three-phase inverter having the circuit 200 in three sets.

The circuit 200 includes one or more semiconductor devices 100 described in FIGS. 1 to 8.

In the example of FIG. 9, the circuit 200 includes the four semiconductor devices 100. As shown in FIG. 9, the semiconductor device 100-1 and the semiconductor device 100-2 are connected in parallel and configure an upper arm of the inverter.

The semiconductor device 100-3 and the semiconductor device 100-4 are connected in parallel and configure a lower arm of the inverter.

The upper arm and the lower arm are connected in series.

The circuit 200 may have gate terminals a P terminal, an N terminal and an output terminal.

The P terminal and the N terminal are connected with an external power supply.

The gate terminal G is input with a gate voltage for controlling each semiconductor device 100.

The output terminal is connected to a node between the upper arm and the lower arm.

The output terminal is also connected with an external load.

Figure 10:
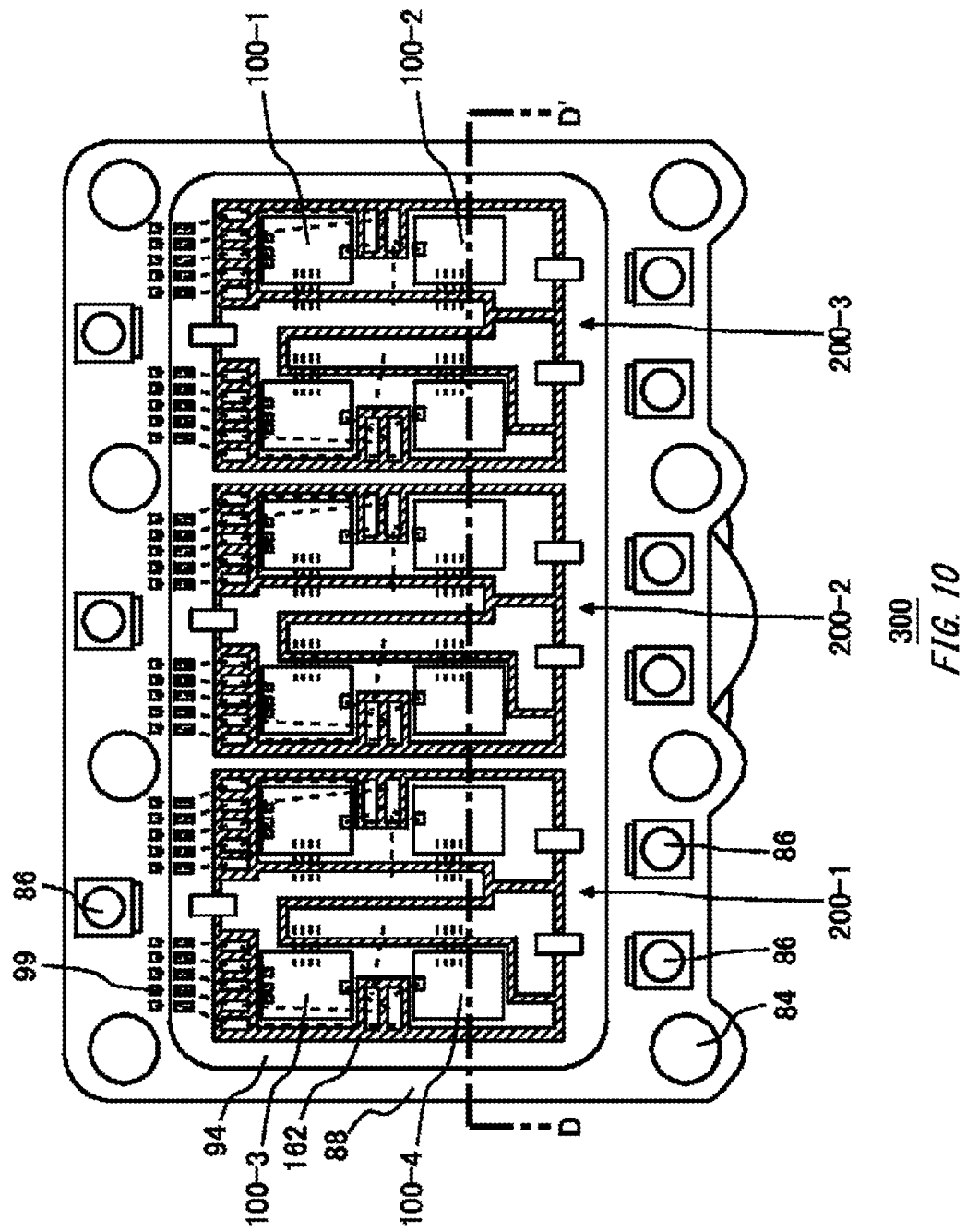
FIG. 10 is a top view showing an example of a semiconductor module 300.

FIG. 10 is a top view showing an example of a semiconductor module 300.

The semiconductor module 300 is a semiconductor package including a plurality of semiconductor devices 100.

The semiconductor module 300 has a housing 88 and the circuit 200.

The housing 88 is configured to accommodate the circuit 200.

The circuit 200 may be placed on a bottom surface 94 of the housing 88.

The housing 88 is, for example, a resin casing formed of resin.

The housing 88 of the present example is configured to accommodate the circuit 200 shown in FIG. 9 in three sets. The semiconductor module 300 of the present example is configured to function as a three-phase inverter.

The housing 88 has a plurality of main terminals 86 and a plurality of control terminals 99.

The main terminals 86 are configured to function as the P terminal, the N terminal and the output terminal in FIG. 9. The control terminals 99 are configured to function as the gate terminals G in FIG. 9.

The control terminals 99 may include a terminal configured to detect current flowing in each semiconductor device 100, a terminal configured to detect the temperature of the semiconductor device 100, and the like.

A circuit board 162 is placed on the bottom surface 94 of the housing 88. On the circuit board 162, the plurality of semiconductor devices 100 and a wiring pattern are provided.

The wiring pattern is configured to connect each node such as each terminal of the semiconductor device 100, the main terminal 86 and the control terminal 99.

The housing 88 may also be provided with a wire for connecting each node or a wiring such as a lead frame.

A cooling portion configured to cool the semiconductor module 300 may be arranged below the housing 88.

In FIG. 10, the cooling portion is omitted.

The housing 88 may have through-holes 84 for fixing the semiconductor module 300 to an external apparatus.

Figure 11:
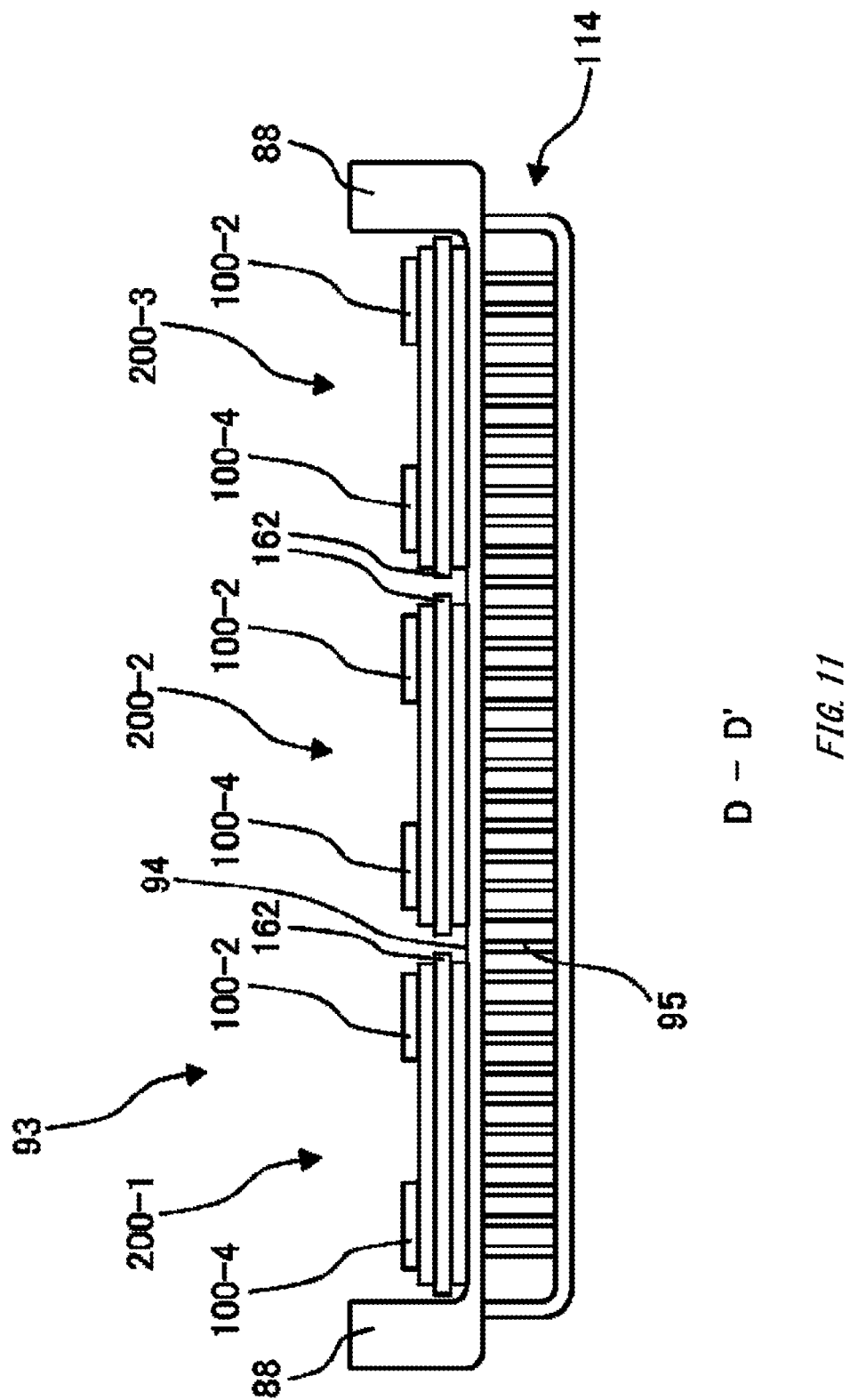
FIG. 11 shows an example of a D-D' cross section in FIG. 10.

FIG. 11 shows an example of a D-D' cross section in FIG. 10.

The D-D' cross section is a cross section passing through the semiconductor device 100-2 and the semiconductor device 100-4.

As described above, the cooling portion 114 is provided below the housing 88.

In the cooling portion 114, a coolant such as water flows.

In the cooling portion 114, cooling pins 95 for increasing a contact area with the coolant may be provided.

The cooling pins 95 may be connected to a lower surface of the housing 88.

The housing 88 may have a concave portion 93 configured to accommodate the circuit 200.

In the concave portion 93, a seal material such as silicon gel for sealing the circuit 200 may be filled.

Figure 12:
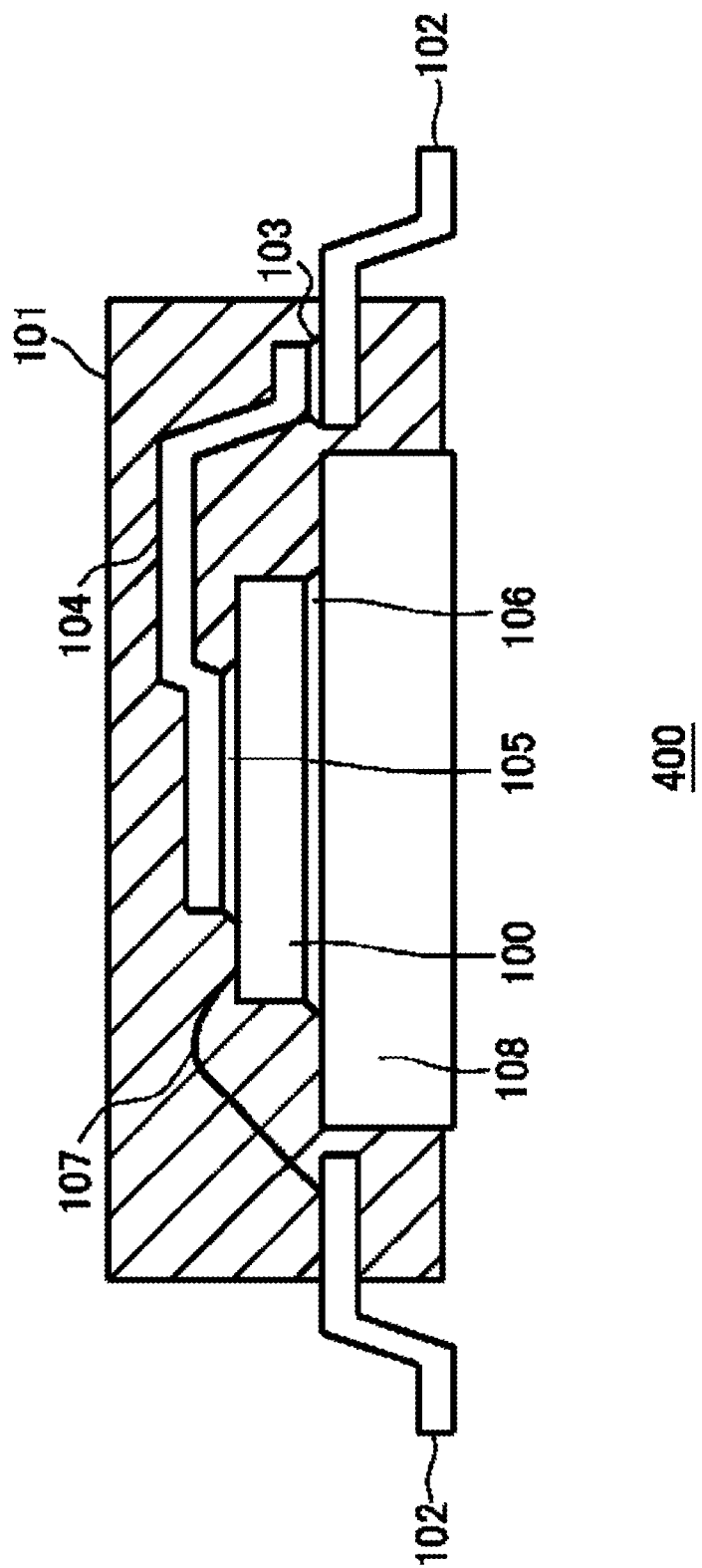
FIG. 12 is a cross sectional view showing an example of a semiconductor discrete 400.

FIG. 12 is a cross sectional view showing an example of a semiconductor discrete 400.

The semiconductor discrete 400 is a semiconductor package including one semiconductor device 100.

The semiconductor discrete 400 of the present example has a sealing portion 101, one or more terminals 102, a connection portion 103, a connection portion 105, a connection portion 106, a wiring 104, a wiring 107 and a chip mounting portion 108.

The chip mounting portion 108 is configured to place the semiconductor device 100.

The chip mounting portion 108 may be electrically connected to an electrode formed on the lower surface of the semiconductor device 100 via the connection portion 106. The chip mounting portion 108 may be formed by a conductive member such as copper.

The chip mounting portion 108 may be configured to function as a terminal that is electrically connected to an external circuit.

The chip mounting portion 108 may also be fixed to an external cooling apparatus The connection portion 103, the connection portion 105 and the connection portion 106 are formed of a conductive material such as soldering.

The terminals 102 are connected to each electrode of the semiconductor device 100.

For example, the semiconductor discrete 400 may have the terminal 102 that is connected to a main electrode formed on the upper surface of the semiconductor device 100, and the terminal 102 that is connected to a control electrode formed on the upper surface of the semiconductor device 100.

The main electrode is, for example, an emitter electrode in an IGBT.

The control electrode is, for example, a gate electrode in the IGBT.

The wiring 104 and the wiring 107 electrically connect each terminal 102 and the semiconductor device 100.

The wiring 104 and the wiring 107 are, for example, linear wires or plate-shaped lead frames.

In the present example, the wiring 104 is a lead frame, and the wiring 107 is a wire.

The connection portion 103 connects the wiring 104 and the terminal 102.

The connection portion 105 connects the wiring 104 and the electrode of the semiconductor device 100.

The wiring 107 may be bonded to the terminal 102 and the electrode of the semiconductor device 100.

The sealing portion 101 is configured to seal the semiconductor device 100 so that the semiconductor device 100 is not exposed to an exterior.

The sealing portion 101 is formed of an insulating material. The sealing portion 101 may be resin such as epoxy or ceramic.

The sealing portion 101 may be configured to seal the wiring 104 and the wiring 107 so that the wiring 104 and the wiring 107 are not exposed to the exterior.

The sealing portion 101 may be configured to seal each terminal 102.

However, an end portion of the terminal 102 is exposed to an exterior of the sealing portion 101.

The sealing portion 101 may be configured to seal the chip mounting portion 108.

A lower surface of the chip mounting portion 108 may be exposed to the exterior of the sealing portion 101.

As described in FIG. 8, after testing the semiconductor device 100 by the test process S208, the non-defective semiconductor device is incorporated into the semiconductor module such as the semiconductor module 300 or the semiconductor discrete 400.

Therefore, a failure rate in the package test process S218 can be reduced to reduce the manufacturing cost.

While the embodiments of the present invention have been described, the technical scope of the invention is not limited to the above described embodiments.

It is apparent to persons skilled in the art that various alterations and improvements can be added to the above-described embodiments.

It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process.

Even if the process flow is described using phrases such as "first" or "next" in the claims, embodiments, or diagrams, it does not necessarily mean that the process must be performed in this order.

EXPLANATION OF REFERENCES

10: semiconductor substrate, 12: emitter region, 14: base region, 18: drift region, 21: upper surface, 37: through-hole, 38: interlayer insulating film, 39: contact hole, 40: gate trench portion, 42: gate insulating film, 44: gate conductive portion, 52: metal electrode, 53: plated layer, 84: through-hole, 86: main terminal, 88: housing, 93: concave portion, 94: bottom surface, 95: cooling pin, 99: control terminal, 100: semiconductor device, 101: sealing portion, 102: terminal, 103: connection portion, 104: wiring, 105: connection portion, 106: connection portion, 107: wiring, 108: chip mounting portion, 114: cooling portion, 162: circuit board, 200: circuit, 300: semiconductor module, 400: semiconductor discrete

What is claimed is:

1. A fabrication method of a semiconductor device comprising:
   forming a semiconductor element including a gate insulating film in a semiconductor substrate and forming a metal electrode above the semiconductor substrate;
   plating the metal electrode;
   annealing the semiconductor substrate;
   applying a voltage corresponding to a thickness of the gate insulating film to the gate insulating film after the annealing; and
   measuring a threshold voltage of the semiconductor element after the voltage applying, and judging a quality of the semiconductor element based on a measurement result.

2. The fabrication method of a semiconductor device according to claim 1, wherein
   in the voltage applying, a voltage by which an electric field greater than 3.64 kV/μm is applied with respect to a unit thickness of the gate insulating film is applied to the gate insulating film.

3. The fabrication method of a semiconductor device according to claim 2, wherein
   in the element forming, a gate conductive portion insulated from the semiconductor substrate by the gate insulating film is formed and an interlayer insulating film for insulating the gate conductive portion and the metal electrode each other is formed, and
   in the annealing, the semiconductor substrate is annealed so that an average diffusion distance of sodium in the interlayer insulating film is 70% or more of a thickness of the interlayer insulating film.

4. The fabrication method of a semiconductor device according to claim 1, wherein in the voltage applying, a voltage by which an electric field of 4.55 kV/μm or more is applied is applied to the gate insulating film.

5. The fabrication method of a semiconductor device according to claim 4, wherein
in the element forming, a gate conductive portion insulated from the semiconductor substrate by the gate insulating film is formed and an interlayer insulating film for insulating the gate conductive portion and the metal electrode each other is formed, and
in the annealing, the semiconductor substrate is annealed so that an average diffusion distance of sodium in the interlayer insulating film is 70% or more of a thickness of the interlayer insulating film.

6. The fabrication method of a semiconductor device according to claim 1, wherein
in the voltage applying, an applying time of the voltage is 10 seconds or less.

7. The fabrication method of a semiconductor device according to claim 6, wherein
in the element forming, a gate conductive portion insulated from the semiconductor substrate by the gate insulating film is formed and an interlayer insulating film for insulating the gate conductive portion and the metal electrode each other is formed, and
in the annealing, the semiconductor substrate is annealed so that an average diffusion distance of sodium in the interlayer insulating film is 70% or more of a thickness of the interlayer insulating film.

8. The fabrication method of a semiconductor device according to claim 1, wherein
in the voltage applying, an applying time of the voltage is 1 second or less.

9. The fabrication method of a semiconductor device according to claim 1, wherein
in the element forming, a gate conductive portion insulated from the semiconductor substrate by the gate insulating film is formed and an interlayer insulating film for insulating the gate conductive portion and the metal electrode each other is formed, and
in the annealing, the semiconductor substrate is annealed so that an average diffusion distance of sodium in the interlayer insulating film is 70% or more of a thickness of the interlayer insulating film.

10. The fabrication method of a semiconductor device according to claim 9, wherein
in the element forming, the gate insulating film is formed so as to cover an inner wall of a trench provided in an upper surface of the semiconductor substrate and the gate conductive portion is formed on a further inner side than the gate insulating film in the trench.

11. The fabrication method of a semiconductor device according to claim 1, wherein
in the annealing, an annealing temperature is 240° C. or higher and 300° C. or lower.

12. The fabrication method of a semiconductor device according to claim 1, comprising assembling a semiconductor package by using the semiconductor element judged as being non-defective by the judging.

13. A test method of testing a semiconductor device comprising a semiconductor substrate in which a semiconductor element having a gate insulating film is formed, and a metal electrode formed above the semiconductor substrate and having a plated upper surface, the test method comprising:
annealing the semiconductor substrate in a chip or wafer form before being incorporated into a semiconductor package;
applying a voltage corresponding to a thickness of the gate insulating film to the gate insulating film after the annealing; and
measuring a threshold voltage of the semiconductor element after the voltage applying and judging a quality of the semiconductor element based on a measurement result.

14. The test method according to claim 13, wherein
the semiconductor substrate comprises a gate conductive portion insulated from the semiconductor substrate by the gate insulating film and an interlayer insulating film for insulating the gate conductive portion and the metal electrode each other.

15. The test method according to claim 14, wherein
in the annealing, the semiconductor substrate is annealed so that an average diffusion distance of sodium in the interlayer insulating film is 70% or more of a thickness of the interlayer insulating film.

16. The test method of a semiconductor device according to claim 13, wherein
in the voltage applying, a voltage by which an electric field greater than 3.64 kV/μm is applied with respect to a unit thickness of the gate insulating film is applied to the gate insulating film.

17. The test method according to claim 13, wherein
in the voltage applying, a voltage by which an electric field of 4.55 kV/μm or more is applied is applied to the gate insulating film.

18. The test method according to claim 13, wherein
in the voltage applying, an applying time of the voltage is 10 seconds or less.

19. The test method according to claim 13, wherein
in the voltage applying, an applying time of the voltage is 1 second or less.

20. The test method according to claim 13, wherein
in the annealing, an annealing temperature is 240° C. or higher and 300° C. or lower.

* * * * *